(12) United States Patent
Lin et al.

(10) Patent No.: US 8,724,272 B2
(45) Date of Patent: May 13, 2014

(54) ESD PROTECTION DEVICE WITH A TUNABLE HOLDING VOLTAGE FOR A HIGH VOLTAGE PROGRAMMING PAD

(75) Inventors: Ying-Chang Lin, Singapore (SG); Da-Wei Lai, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 51 days.

(21) Appl. No.: 13/454,340

(22) Filed: Apr. 24, 2012

(65) Prior Publication Data

US 2013/0279052 A1   Oct. 24, 2013

(51) Int. Cl.
*H02H 3/22* (2006.01)

(52) U.S. Cl.
USPC .................................. 361/56; 361/111

(58) Field of Classification Search
USPC .................................... 361/56, 111
See application file for complete search history.

(56) References Cited

U.S. PATENT DOCUMENTS

| | | | |
|---|---|---|---|
| 6,803,633 B2 * | 10/2004 | Mergens et al. | 257/358 |
| 2004/0065895 A1 * | 4/2004 | Lai et al. | 257/107 |
| 2006/0151836 A1 * | 7/2006 | Salcedo et al. | 257/362 |

\* cited by examiner

*Primary Examiner* — Danny Nguyen
(74) *Attorney, Agent, or Firm* — Ditthavong Mori & Steiner, P.C.

(57) ABSTRACT

An ESD protection device with a tunable holding voltage is disclosed. Embodiments include: providing a silicon-controlled rectifier (SCR) having a first n-type layer with a cathode connection, a first p-type layer with a first control connection, a second n-type layer with a second control connection, and a second p-type layer with an anode connection; coupling the anode connection to a power rail; coupling the cathode connection to a ground rail; providing a tunable holding voltage control unit including a first NMOS having a first gate, a first drain, and a first source, wherein during an ESD event, the first NMOS is turned off and a holding voltage of the SCR is low; coupling the first drain to the first control connection; coupling the first source to the ground rail; and coupling the first gate to a program circuit.

18 Claims, 4 Drawing Sheets

ESD PROTECTION DEVICE WITH A TUNABLE HOLDING VOLTAGE FOR A HIGH VOLTAGE PROGRAMMING PAD

TECHNICAL FIELD

The present disclosure relates to electrostatic discharge (ESD) protection circuits. The present disclosure is particularly applicable to ESD protection circuits with a high voltage programming pad.

BACKGROUND

Generally, read-only memory (ROM) will include a high voltage programming pin (VPP) to induce channel hot electrons or to program memory cells. A device may, for instance, include a VPP which may accept a high voltage signal (e.g., 7 volts) for programming, and an ESD protection circuit to conduct large ESD current during, for example, an ESD event. Typically, from an ESD protection design point of view, the ESD protection circuit should have a small pad area, low power on rise time, and be latch-up free. In addition, from a time to market and cost point of view, the ESD protection circuit should be easily implemented for many process nodes, for example, by allowing for a one shot tape-out and requiring no mask revisions. As such, manufacturers face significant challenges for providing ESD protection circuits to address design, time to market, and cost criteria.

One commonly used ESD protection scheme uses a grounded-gate NMOS (ggNMOS). However, a ggNMOS has a large pad area (e.g., 50% of the ROM chip area), and often has a triggering voltage (e.g., 7 volts) close to a voltage of the VPP (e.g., 7 volts), which frequently causes a mistriggering of the ggNMOS resulting in a failure in functionality. Thus, an ESD protection scheme using a ggNMOS is generally unsuitable for ESD protection for circuits with a high voltage programming pad.

FIG. 1 schematically illustrates an RC clamp which is a first common solution for providing ESD protection for circuits with a high voltage programming pad. As shown, the circuit in FIG. 1 includes a VPP 101 connected to a power rail 103. Moreover, the power rail 103 is connected to a resistor 105, which in turn is connected to a ground rail 107 through a capacitor 109, and also to the gates of transistors 111 and 113. Additionally, the gate of a transistor 115 is connected to the drains of transistors 111 and 113. Resistor 105 and capacitor 109 are used to obtain a long RC time constant to turn on transistor 115. When turned on, transistor 115 creates a path 117 to conduct large ESD current during an ESD event, such as ESD zapping. However, the RC clamp ESD protection scheme in FIG. 1 requires a large pad area to implement the resistor 105, capacitor 109, and transistor 115, in order to gain a robust ESD performance. Additionally, circuits including a one-time programming (OTP) or multi-time programming (MTP) ROM cannot reduce the power up rise time due to a possibility of introducing false triggering during testing. Thus, the ESD protection scheme in FIG. 1 constrains testing time.

FIG. 2 schematically illustrates a common ESD protection circuit using a traditional LVTSCR. As shown, the circuit in FIG. 2 includes a low voltage (e.g., 8 volts to 8.5 volts) triggered silicon-controlled rectifier 201 (LVTSCR) having a first n-type layer with a cathode connection 203 connected to a ground rail, a first p-type layer, a second n-type layer with a control connection 205 connected to a trigger component 207, and a second p-type layer with an anode connection 209 connected to a power rail. The LVTSCR ESD protection requires only a small pad area. However, when this device is triggered, snapback will be induced and the operation voltage between VPP pad and ground will be clamped at a very low voltage, holding voltage Vh. A low Vh yields good ESD performance. However, during normal operation (e.g., an operating voltage of 1.8 volts, 3.3 volts, etc.), the holding voltage Vh will be less than the normal operating voltage, which, causes the LVTSCR to latch-up, resulting in a failure of chip function.

A need therefore exists for methodology enabling ESD protection for circuits with a high voltage programming pad that has a small pad area, low power on rise time, and is latch-up free.

SUMMARY

An aspect of the present disclosure is a circuit implementing an ESD protection device with a tunable holding voltage.

Another aspect of the present disclosure is a method for implementing an ESD protection device with a tunable holding voltage.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: a silicon-controlled rectifier (SCR) having a first n-type layer with a cathode connection, a first p-type layer with a first control connection, a second n-type layer with a second control connection, and a second p-type layer with an anode connection, wherein the anode connection is coupled to a power rail, and the cathode connection is coupled to a ground rail; and a tunable holding voltage control unit including a first NMOS having a first gate, a first drain, and a first source, the first drain being coupled to the first control connection, the first source being coupled to the ground rail, and the first gate being coupled to a program circuit, wherein during an ESD event, the first NMOS is turned off and a holding voltage of the SCR is low.

Aspects include a circuit, wherein during normal operation, the first NMOS is turned on. Some aspects include a circuit, wherein the tunable holding voltage control unit further includes a second NMOS having a second gate, a second drain, and a second source, the second drain being coupled to the first control connection, the second source being coupled to the ground rail, and the second gate being coupled to the program circuit, wherein during an ESD event, the first and second NMOS are turned off and the holding voltage of the SCR is low. Another aspect includes a circuit, wherein during normal operation, the first NMOS is turned on and the second NMOS is turned on when the holding voltage of the SCR with the first NMOS turned on is less than an operating voltage of the power rail. Additional aspects include a circuit, wherein the tunable holding voltage control unit includes n NMOS each having a gate, a drain, and a source, each drain being coupled to the first control connection, each source being coupled to the ground rail, and each gate being coupled to the program circuit, wherein during an ESD event, all n NMOS are turned off and the holding voltage of the SCR is low, wherein n ranges from 3 to 10. Further aspects include a circuit, wherein during normal operation, the first NMOS is turned on and m of the n NMOS are turned on, wherein m NMOS being turned on results in the holding voltage of the SCR being greater than an operating voltage of the power rail. Some aspects include a circuit having a trigger component with a control connection coupled with the second control connection. Further aspects include a circuit having a one-time program or multi-time program circuit with a first output control connection coupled with the first gate.

An additional aspect of the present disclosure is a method including: providing a silicon-controlled rectifier (SCR) having a first n-type layer with a cathode connection, a first p-type layer with a first control connection, a second n-type layer with a second control connection, and a second p-type layer with an anode connection; coupling the anode connection to a power rail; coupling the cathode connection to a ground rail; providing a tunable holding voltage control unit including a first NMOS having a first gate, a first drain, and a first source, wherein during an ESD event, the first NMOS is turned off and a holding voltage of the SCR is low; coupling the first drain to the first control connection; coupling the first source to the ground rail; and coupling the first gate to a program circuit.

Some aspects include the first NMOS being turned on during normal operation. Other aspects include the tunable holding voltage control unit further including a second NMOS having a second gate, a second drain, and a second source, wherein during an ESD event, the first and second NMOS are turned off and the holding voltage of the SCR is low, and the method further including: coupling the second drain to the first control connection; coupling the second source to the ground rail; and coupling the second gate to the program circuit. Further aspects include the first NMOS being turned on during normal operation and the second NMOS being turned on when the holding voltage of the SCR with the first NMOS turned on is less than an operating voltage of the power rail. Additional aspects include the tunable holding voltage control unit including n NMOS each having a gate, a drain, and a source, wherein during an ESD event, all n NMOS are turned off and the holding voltage of the SCR is low, wherein n ranges from 3 to 10, and the method further including: coupling each drain to the first control connection; coupling each source to the ground rail; and coupling each gate to the program circuit. Further aspects include the first NMOS being turned on and m of the n NMOS being turned on during normal operation, wherein m NMOS results in the holding voltage of the SCR being greater than an operating voltage of the power rail. Some aspects include: providing a trigger component with a control connection; and coupling the control connection with the second control connection. Additional aspects include: providing a one-time program or multi-time program circuit with a first output control connection; and coupling the first output control connection with the first gate.

Another aspect of the present disclosure is a circuit including: a silicon-controlled rectifier (SCR) having a first n-type layer with a cathode connection, a first p-type layer with a first control connection, a second n-type layer with a second control connection, and a second p-type layer with an anode connection, wherein the anode connection is coupled to a power rail, and the cathode connection is coupled to a ground rail; a one-time or multi-time program circuit; and a tunable holding voltage control unit including n NMOS each having a gate, a drain, and a source, each drain being coupled to the first control connection, each source being coupled to the ground rail, and each gate being coupled to the program circuit, wherein during an ESD event, the program circuit turns off all n NMOS and a holding voltage of the SCR is less than an operating voltage of the power rail, wherein n ranges from 2 to 10.

Some aspects include a circuit, wherein during normal operation, the program circuit turns on m of the n NMOS, wherein m NMOS raise the holding voltage of the SCR to a value greater than the operating voltage of the power rail. Certain aspects include a circuit having a trigger component with a control connection coupled with the second control connection. Other aspects include a circuit, wherein program circuit comprises a plurality of output control connections, each gate of the n NMOS being coupled to one of the plurality of output control connections.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of large pad area, high power on rise time, and latch-up attendant upon current ESD protection, for instance, in a circuit with a high voltage programming pad. The present disclosure addresses and solves such problems, for instance, by, inter alia, providing, a LVTSCR with a tunable holding voltage, such that the resulting ESD protection circuit has a low tunable holding voltage during an ESD event, and a high tunable holding voltage during normal operation.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
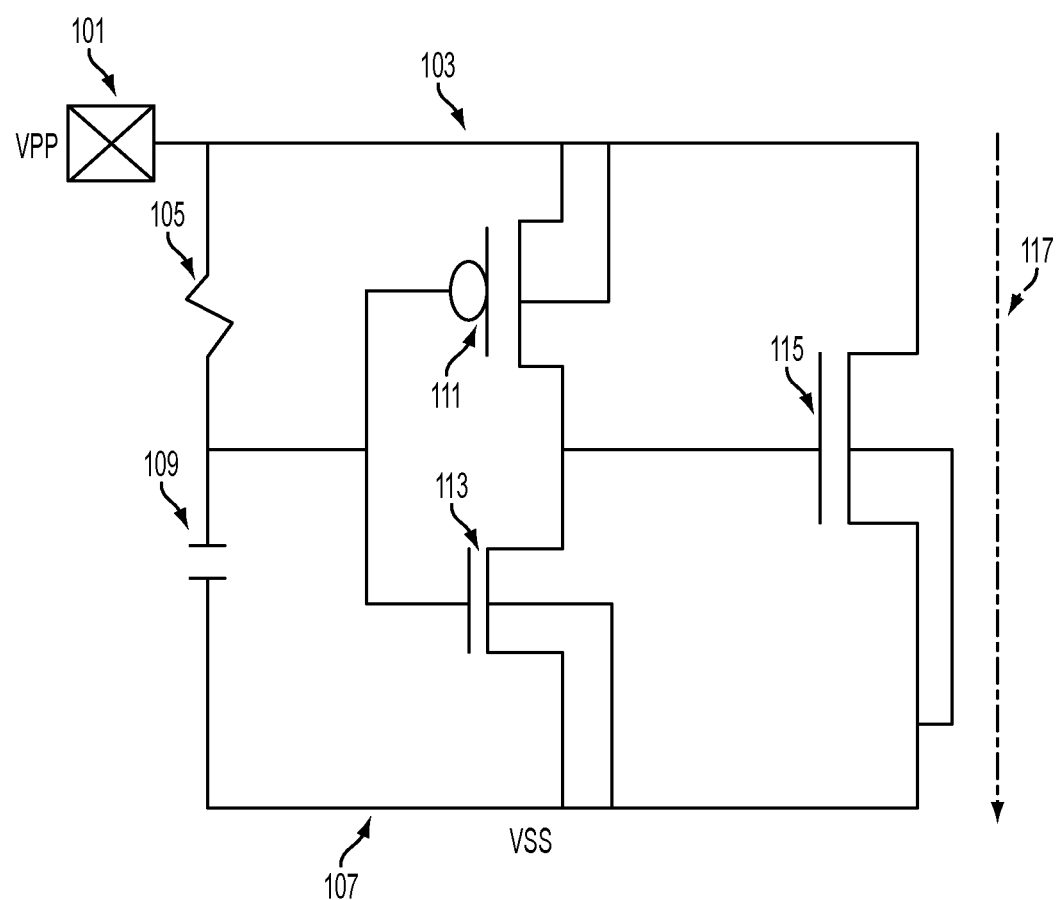
FIG. 1 schematically illustrates a circuit that includes a traditional RC clamp ESD protection scheme.
Figure 2:
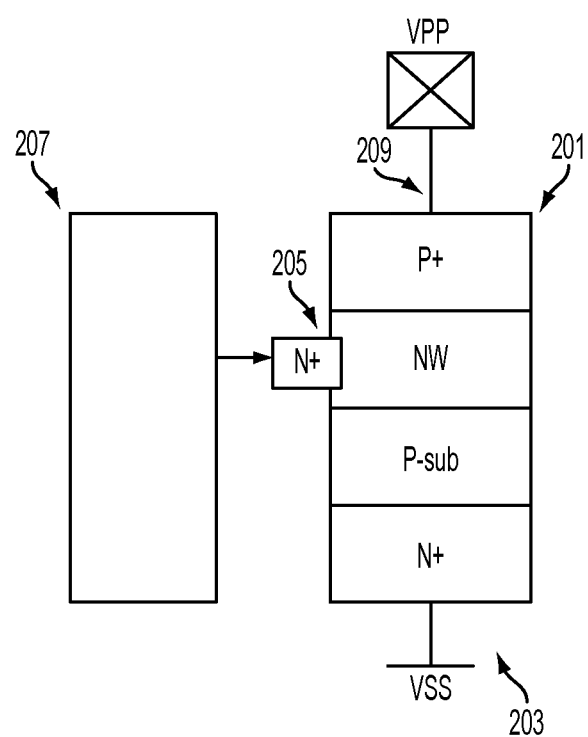
FIG. 2 schematically illustrates a common ESD protection circuit using a traditional LVTSCR.
Figure 3:
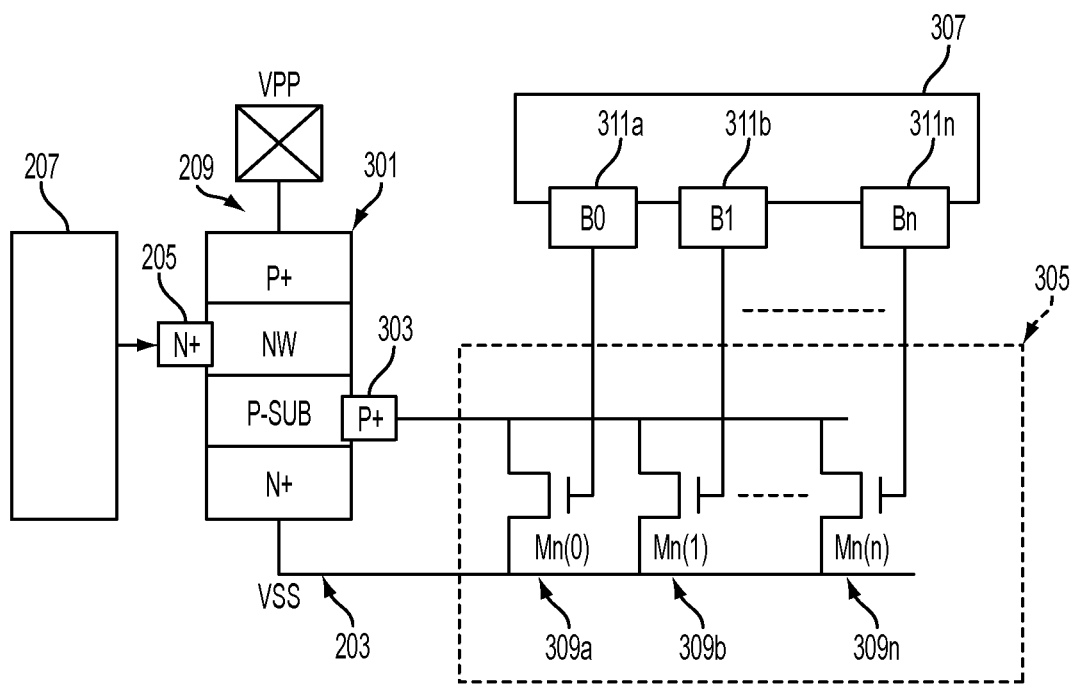
FIG. 3 schematically illustrates a circuit implementing an ESD protection device with a tunable holding voltage, in accordance with an exemplary embodiment of the present disclosure.

FIG. 3 schematically illustrates a circuit implementing a LVTSCR with a tunable holding voltage, in accordance with an exemplary embodiment of the present disclosure. For example, the circuit shown in FIG. 3 includes the trigger component 207, VPP, and VSS (arranged similar to corresponding components of FIG. 2) and implements an LVTSCR 301, similar to LVTSCR 201 from FIG. 2, with a first control connection 303 connected to the first p-type layer, a tunable holding voltage control unit 305, and a program circuit 307 (e.g., an OTP or an MTP ROM circuit). As shown, the tunable holding voltage control unit 305 includes one or more transistors 309 (e.g., NMOS) each having a gate, a drain, and a source, each drain being coupled to the first control connection 303, each source being coupled to the cathode connection 203, and each gate being coupled to one of one or more latch circuits 311 included on the program circuit 307. During an ESD event, the program circuit 307 may cause the latch circuits 311a through 311n to output signals to turn off the gate of the corresponding transistors 309a through 309n. Consequently, the LVTSCR 301 may have a low holding voltage resulting in a low power on rise time.

During normal operation, the program circuit 307 may cause latch circuit 311a to output a signal to turn on the gate of transistor 309a. Because the transistor 309a is turned on during normal operation, a path connecting the first control connection 303 to the cathode connection 203 will also be available. Moreover, some of the current through the LVTSCR 301 will flow to the tunable holding voltage control unit 305 via transistor 309a to increase the holding voltage of the LVTSCR 301. As more gates of transistors 309a through 309n are turned on, the holding voltage of LVTSCR 301 increases. Thus, by programming program circuit 307 to change the state of the gates of transistors 309a through 309n, the circuit shown in FIG. 3 can have a holding voltage increased above a normal operating voltage to obtain latch-free ESD protection.

Figure 4:
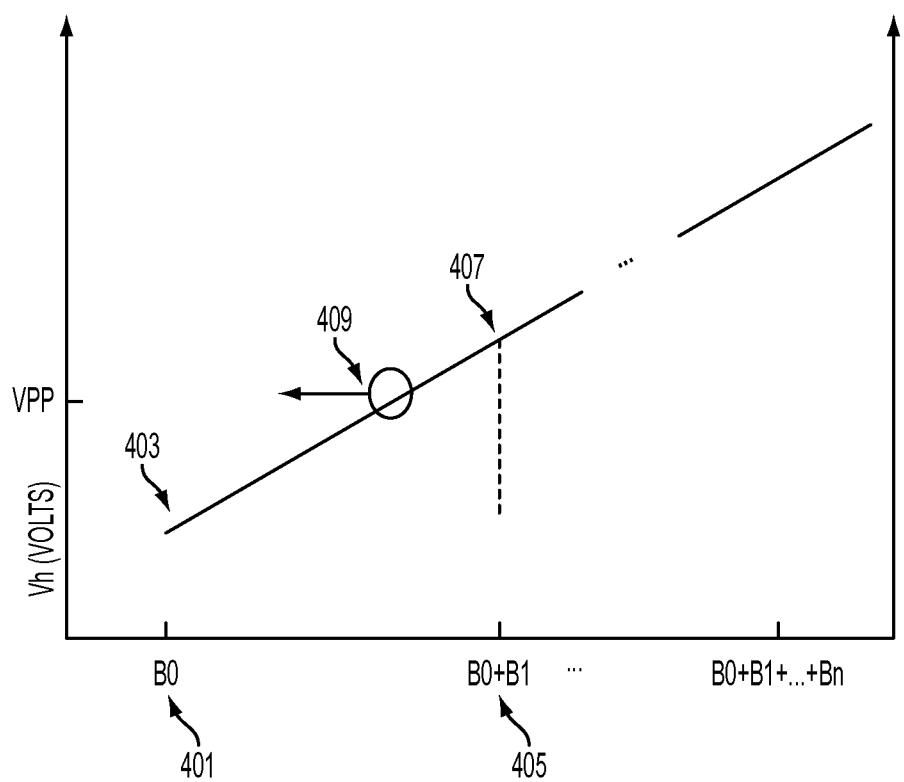
FIG. 4 illustrates an operation of a circuit implementing an ESD protection device with a tunable holding voltage, in accordance with an exemplary embodiment of the present disclosure.

The exemplary results shown in FIG. 4 illustrate how the circuit shown in FIG. 3 may select a number of the transistors 309a through 309n to turn on in order to increase the holding voltage of the LVTSCR 301 above a normal operating voltage. As illustrated, transistor 309a is turned on during a first mode 401 of the normal operation and some of the current through the LVTSCR 301 will flow to the tunable holding voltage control unit 305 via transistor 309a to increase the holding voltage of the LVTSCR 301 to, for instance, a first holding voltage 403. Moreover, the program circuit 307 can be programmed to change the states of subsequent transistors (e.g., transistors 309b, ..., 309n) to change the holding voltage of the LVTSCR 301. Because, for instance, transistor 309b may also be turned on during a second mode 405 of normal operation, more of the current through the LVTSCR 301 will flow to the tunable holding voltage control unit 305 via transistor 309b to further increase the holding voltage of the LVTSCR 301 to, for instance, a second holding voltage 407. Consequently, the program circuit 307 can be programmed to change the holding voltage of the LVTSCR 301 to exceed a normal operating voltage 409.

In addition to providing ESD protection for circuits with a high voltage programming pad that has a low power on rise time and latch-up free operation, the ESD protection scheme of FIG. 3 is easily implemented for many process nodes, allowing for a one shot tape-out and requiring no mask revisions. Additionally, the protection scheme of FIG. 3 requires only a small pad area.

The embodiments of the present disclosure can achieve several technical effects including an ESD protection for circuits with a high voltage programming pad that has a small pad area, low power on rise time, and is latch-up free. The present disclosure enjoys industrial applicability in any of various types of logic, particularly devices with a high voltage programming pad, such as an LCD driver, a micro controller unit (MCU), an OTP ROM, an MTP ROM, and a power management product.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
 a silicon-controlled rectifier (SCR) having a first n-type layer with a cathode connection, a first p-type layer with a first control connection, a second n-type layer with a second control connection, and a second p-type layer with an anode connection, wherein the anode connection is coupled to a power rail, and the cathode connection is coupled to a ground rail; and
 a tunable holding voltage control unit including a first NMOS having a first gate, a first drain, and a first source, the first drain being coupled to the first control connection, the first source being coupled to the ground rail, and the first gate being coupled to a program circuit, wherein during an ESD event, the first NMOS is turned off and a holding voltage of the SCR is low,
 wherein the tunable holding voltage control unit further includes a second NMOS having a second gate, a second drain, and a second source, the second drain being coupled to the first control connection, the second source being coupled to the ground rail, and the second gate being coupled to the program circuit, and
 wherein during an ESD event, the first and second NMOS are turned off and the holding voltage of the SCR is low.

2. The circuit according to claim 1, wherein during normal operation, the first NMOS is turned on.

3. The circuit according to claim 1, wherein during normal operation, the first NMOS is turned on and the second NMOS is turned on when the holding voltage of the SCR with the first NMOS turned on is less than an operating voltage of the power rail.

4. The circuit according to claim 1, wherein the tunable holding voltage control unit includes n NMOS each having a gate, a drain, and a source, each drain being coupled to the first control connection, each source being coupled to the ground rail, and each gate being coupled to the program circuit, wherein during an ESD event, all n NMOS are turned off and the holding voltage of the SCR is low, wherein n ranges from 3 to 10.

5. The circuit according to claim 4, wherein during normal operation, the first NMOS is turned on and m of the n NMOS are turned on, wherein m NMOS being turned on results in the holding voltage of the SCR being greater than an operating voltage of the power rail.

6. The circuit according to claim 1, further comprising:
a trigger component with a control connection coupled with the second control connection.

7. The circuit according to claim 1, wherein the program circuit comprises:
a one-time program or multi-time program circuit with a first output control connection coupled with the first gate.

8. A method comprising:
providing a silicon-controlled rectifier (SCR) having a first n-type layer with a cathode connection, a first p-type layer with a first control connection, a second n-type layer with a second control connection, and a second p-type layer with an anode connection;
coupling the anode connection to a power rail;
coupling the cathode connection to a ground rail;
providing a tunable holding voltage control unit including a first NMOS having a first gate, a first drain, and a first source and a second NMOS having a second gate, a second drain, and a second source, wherein during an ESD event, the first and second NMOS are turned off and a holding voltage of the SCR is low;
coupling the first drain to the first control connection;
coupling the first source to the ground rail;
coupling the first gate to a program circuit;
coupling the second drain to the first control connection;
coupling the second source to the ground rail; and
coupling the second gate to the program circuit.

9. The method according to claim 8, wherein during normal operation, the first NMOS is turned on.

10. The method according to claim 8, wherein during normal operation, the first NMOS is turned on and the second NMOS is turned on when the holding voltage of the SCR with the first NMOS turned on is less than an operating voltage of the power rail.

11. The method according to claim 8, wherein the tunable holding voltage control unit includes n NMOS each having a gate, a drain, and a source, wherein during an ESD event, all n NMOS are turned off and the holding voltage of the SCR is low, wherein n ranges from 3 to 10, and wherein the method comprises:
coupling each drain to the first control connection;
coupling each source to the ground rail; and
coupling each gate to the program circuit.

12. The method according to claim 11, wherein during normal operation, the first NMOS is turned on and m of the n NMOS are turned on, wherein m NMOS results in the holding voltage of the SCR being greater than an operating voltage of the power rail.

13. The method according to claim 8, further comprising:
providing a trigger component with a control connection; and
coupling the control connection with the second control connection.

14. The method according to claim 8, further comprising:
providing a one-time program or multi-time program circuit with a first output control connection; and
coupling the first output control connection with the first gate.

15. A circuit comprising:
a silicon-controlled rectifier (SCR) having a first n-type layer with a cathode connection, a first p-type layer with a first control connection, a second n-type layer with a second control connection, and a second p-type layer with an anode connection, wherein the anode connection is coupled to a power rail, and the cathode connection is coupled to a ground rail;
a one-time or multi-time program circuit; and
a tunable holding voltage control unit including n NMOS each having a gate, a drain, and a source, each drain being coupled to the first control connection, each source being coupled to the ground rail, and each gate being coupled to the program circuit, wherein during an ESD event, the program circuit turns off all n NMOS and a holding voltage of the SCR is less than an operating voltage of the power rail, wherein n ranges from 2 to 10.

16. The circuit according to claim 15, wherein during normal operation, the program circuit turns on m of the n NMOS, wherein m NMOS raise the holding voltage of the SCR to a value greater than the operating voltage of the power rail.

17. The circuit according to claim 15, further comprising:
a trigger component with a control connection coupled with the second control connection.

18. The circuit according to claim 15, wherein the program circuit comprises a plurality of output control connections, each gate of the n NMOS being coupled to one of the plurality of output control connections.

* * * * *